(12) United States Patent
Mizusawa et al.

(10) Patent No.: US 8,476,811 B2
(45) Date of Patent: Jul. 2, 2013

(54) PIEZOELECTRIC DEVICE WITH TUNING-FORK TYPE PIEZOELECTRIC VIBRATING PIECE

(75) Inventors: Shuichi Mizusawa, Sayama (JP); Takehiro Takahashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/192,883

(22) Filed: Jul. 28, 2011

(65) Prior Publication Data

US 2012/0032561 A1 Feb. 9, 2012

(30) Foreign Application Priority Data

Aug. 7, 2010 (JP) .................................. 2010-178228
Mar. 15, 2011 (JP) .................................. 2011-056555

(51) Int. Cl.
*H01L 41/047* (2006.01)
*H01L 41/053* (2006.01)
*H03H 9/21* (2006.01)

(52) U.S. Cl.
USPC ........................... 310/348; 310/365; 310/370

(58) Field of Classification Search
USPC ................. 310/340, 344, 348, 360, 365, 366, 310/370; 117/63, 71, 72, 902
See application file for complete search history.

(56) References Cited

U.S. PATENT DOCUMENTS

| | | | | |
|---|---|---|---|---|
| 4,362,961 A * | 12/1982 | Gerber | ........................ | 310/370 |
| 2007/0228891 A1 * | 10/2007 | Tanaya | ........................ | 310/348 |
| 2010/0156246 A1 * | 6/2010 | Iwai | ........................ | 310/344 |
| 2011/0234052 A1 * | 9/2011 | Amano et al. | ................ | 310/344 |
| 2011/0241491 A1 * | 10/2011 | Takahashi | ..................... | 310/344 |
| 2011/0260585 A1 * | 10/2011 | Ichikawa et al. | ............. | 310/344 |
| 2012/0032562 A1 * | 2/2012 | Mizusawa | ..................... | 310/344 |
| 2012/0068578 A1 * | 3/2012 | Takahashi | ..................... | 310/344 |
| 2012/0098390 A1 * | 4/2012 | Takahashi | ..................... | 310/348 |
| 2012/0169182 A1 * | 7/2012 | Mizusawa et al. | ............ | 310/348 |
| 2012/0176004 A1 * | 7/2012 | Mizusawa et al. | ............ | 310/348 |

FOREIGN PATENT DOCUMENTS

| | | |
|---|---|---|
| JP | 53-42585 A | 4/1978 |
| JP | 57-125510 A | 8/1982 |
| JP | 61-50413 A | 3/1986 |

(Continued)

OTHER PUBLICATIONS

International Search Report, PCT/JP2006/1315825, mailed Nov. 21, 2006.

*Primary Examiner* — Thomas Dougherty
(74) *Attorney, Agent, or Firm* — Alix, Yale & Ristas, LLP

(57) ABSTRACT

To provide the piezoelectric device and the manufacturing method thereof, in which the quartz-crystal side surface electrodes and the base side surface electrodes are ensured to be electrically connected without disconnection. The piezoelectric device (100) comprises: a piezoelectric vibrating piece (21), an outer frame (22), a piezoelectric frame (20) for forming a first castellation (204), a package base (12) which is bonded by to the outer frame by adhesive (13) and which the second castellation is formed, and a package lid (11). The piezoelectric frame comprises: an excitation electrodes, a second extraction electrodes and a first side surface electrodes formed on the first castellation. The package base comprises: a second side surface electrode formed on the second castellation, and an external electrode. A pair of connection electrodes (14) is formed on the first castellation or second castellation, for electrically connecting the first side surface electrode or the first extraction electrode to the second side surface electrode.

16 Claims, 15 Drawing Sheets

FOREIGN PATENT DOCUMENTS

| | | |
|---|---|---|
| JP | 02-298110 A | 12/1990 |
| JP | 5-183375 A | 7/1993 |
| JP | 2001-345656 A | 12/2001 |
| WO | WO2007/023685 A1 | 3/2007 |

* cited by examiner

PIEZOELECTRIC DEVICE WITH TUNING-FORK TYPE PIEZOELECTRIC VIBRATING PIECE

CROSS-REFERENCE TO RELATED APPLICATION

This application claims priority to and the benefit of Japan Patent Application No. 2010-178228, filed on Aug. 7, 2010, and Japan Patent Application No. 2011-056555, filed on Mar. 15, 2011 in the Japan Patent Office, the disclosures of which are incorporated herein by reference in their entirety.

FIELD

This disclosure pertains to, inter alia, piezoelectric devices having an AT-cut piezoelectric vibrating piece set that vibrates in the thickness-shear vibration mode or a tuning-fork type piezoelectric vibrating piece having a pair of vibrating arms contained within a cavity defined by a package. This disclosure also pertains to methods for manufacturing such devices.

DESCRIPTION OF THE RELATED ART

Piezoelectric devices, such as piezoelectric vibrators and SAW filters, are usually encased in a package configured for SMD (surface-mounting of the devices. For package of such piezoelectric vibrating device or piezoelectric device, a quartz-crystal package made of piezoelectric material such as quartz-crystal formed by etching, and glass package made of glass are recommended for use.

For example, patent document WO2007/023685 discloses a piezoelectric device comprising castellations on four respective corners of the piezoelectric element (quartz-crystal frame) and the base (package base), and metal films are formed on respective castellations for forming electrodes. Thereby the mounting side portion (external electrode) and extraction electrode extracted from excitation electrodes are electrically connected through the metal film formed on respective castellations.

However, in the piezoelectric device disclosed in the patent document WO2007/023685, metal films formed on castellations of the quartz-crystal frame and metal films formed on castellations of the package base are connected by metal films. Thus, the connection between the metal film on the quartz-crystal frame and the metal film on the package base are not securely connected, thus increasing the likelihood of disconnection between the quartz-crystal frame and package base.

An object of the present disclosure is to provide a piezoelectric device in which the electrical connection between the piezoelectric side surface electrode and base side surface electrode are ensured to be electrically connected with improved reliability and method for manufacturing the piezoelectric device thereof.

SUMMARY

The first aspect is directed to a piezoelectric device. The piezoelectric device comprises: a piezoelectric frame having a piezoelectric vibrating piece for vibrating when electrically energized, an outer frame, formed as one unit with the piezoelectric vibrating piece and including a first principal surface and a second principal surface, for surrounding the piezoelectric vibrating piece, and a pair of first castellations formed on peripheral edge of the outer frame; a package base, including a first surface, a second surface opposite the first surface, and a pair of second castellations formed on peripheral edge, wherein the first surface of the base is bonded to the first principal surface of the outer frame by nonconductive adhesive; and a package lid, bonded to the second principal surface by nonconductive adhesive, for sealing the piezoelectric vibrating piece with the package base.

The piezoelectric frame comprises: a pair of excitation electrodes, formed on both the first principal surface and the second principal surface of the piezoelectric vibrating piece; a first extraction electrode on the first principal surface of the outer frame, extracted from the excitation electrode on the first principal surface of the outer frame to the first castellation; a second extraction electrode on the second principal surface of the outer frame, extracted from the excitation electrode on the second principal surface of the outer frame to the first castellation; and the first side surface electrode electrically connected to the second extraction electrode and formed onto the first castellation.

The package base comprises a pair of second side surface electrodes that is electrically connected to the first side surface electrode or the first extraction electrode and formed on the pair of the second castellation.

A pair of the connection electrode is formed on the first castellation and the second castellation, for electrically connecting the first side surface electrode or the first extraction electrode to the second side surface electrode.

The second aspect is directed to a piezoelectric device. The nonconductive adhesive is formed on the first castellation and the second castellation, in a way it covers the connection electrode.

The third aspect is directed to a piezoelectric device. When looking from the first principal surface to the second principal surface, the periphery of the outer frame and periphery of the package base are rectangular, and the first castellation and the second castellation are formed on corners of the rectangle.

The fourth aspect is directed to a piezoelectric device. When looking from the first principal surface to the second principal surface, the periphery of the outer frame and periphery of the package base are rectangular, and the first castellation and the second castellation are formed on sides of rectangle.

The fifth aspect is directed to a piezoelectric device. The piezoelectric vibrating piece has thickness-shear vibrating mode; the periphery of the outer frame and periphery of the package base are rectangular, having a long side and a short side that is shorter than the long side; and the first castellation and the second castellation are formed along the short side.

The sixth aspect is directed to a piezoelectric device. The pair of the first castellation is disposed on both ends of the short side, the pair of the first castellation is disposed along the center line that goes through center of the piezoelectric vibrating piece and is parallel to the long side, and the pair of the second castellation is disposed on both ends of the short side, the pair of the second castellation is disposed along the center line that goes through center of the package base and is parallel to the long side.

The seventh aspect is directed to a piezoelectric device. The adhesive includes a low-melting-point glass or polyimide resin having lower melting point than melting point of the base portion or the lid portion.

The eighth aspect is directed to a piezoelectric device. The piezoelectric vibrating piece is a piezoelectric vibrating piece having thickness-shear vibrating mode or a tuning-fork type piezoelectric vibrating piece having a pair of vibrating arms.

The ninth aspect is directed to a method of manufacturing a piezoelectric device according to the disclosure. The manufacturing method of the piezoelectric device comprises a first preparation step for preparing a piezoelectric wafer, including a plurality of piezoelectric frames, the piezoelectric frame having a piezoelectric vibrating piece including a first principal surface and a second principal surface and an outer frame that surrounds the piezoelectric vibrating piece and supports thereof, and at least a pair of first cut-holes disposed between adjacent outer frames, the first cut-hole extends through the first principal surface to the second principal surface; a first electrode forming step for forming a pair of excitation electrodes formed on the first principal surface and the second principal surface of the piezoelectric frame; a pair of extraction electrodes extracted from the pair of the excitation electrodes to the pair of the first cut-hole; and a first side surface electrode for electrically connecting to the extraction electrode, the first side surface electrode is formed on the first cut-hole; a second preparation step for preparing a first wafer, including a plurality of base portions having a first surface and a second surface opposite the first surface, and at least a pair of second cut-holes, which matches to position of the pair of first cut-holes and extends through the package base; a second electrode forming step for forming a second side surface electrode, in which the electrode thereof is formed on the second cut-hole and is electrically connected to the first side surface electrode; a first bonding step for bonding the first surface of the first lid wafer onto the first principal surface of the piezoelectric wafer; and a third electrode forming step for forming a connection electrode after the first bonding step on the first castellation and the second castellation, in a way that it covers the first side surface electrode an the second side surface electrode.

The tenth aspect is directed to a method of manufacturing a piezoelectric device. During the second electrode forming step or the third electrode forming step, a pair of external electrodes is formed on the second surface of the first wafer, which is electrically connected to the second side surface electrode.

The eleventh aspect is directed to a method of manufacturing a piezoelectric device. The manufacturing method of the piezoelectric device further comprises a third preparation step for preparing a second wafer having a plurality of package lids for bonding to the outer frame of the piezoelectric device; and a second bonding step, after the first bonding step and the third electrode forming step, for bonding the second wafer onto the second principal surface of the piezoelectric wafer with adhesive. During the second bonding step, the adhesive that is melted flows into the first cut-hole and the second cut-hole, so that the connection electrode is covered with the adhesive.

The piezoelectric device of this disclosure provides the quartz-crystal side surface electrode and base side surface electrode electrically connected without disconnection, and the manufacturing method thereof.

DETAILED DESCRIPTION

First Embodiment
<Overall Configuration of the First Quartz-Crystal Vibrating Device 100>

Figure 1:
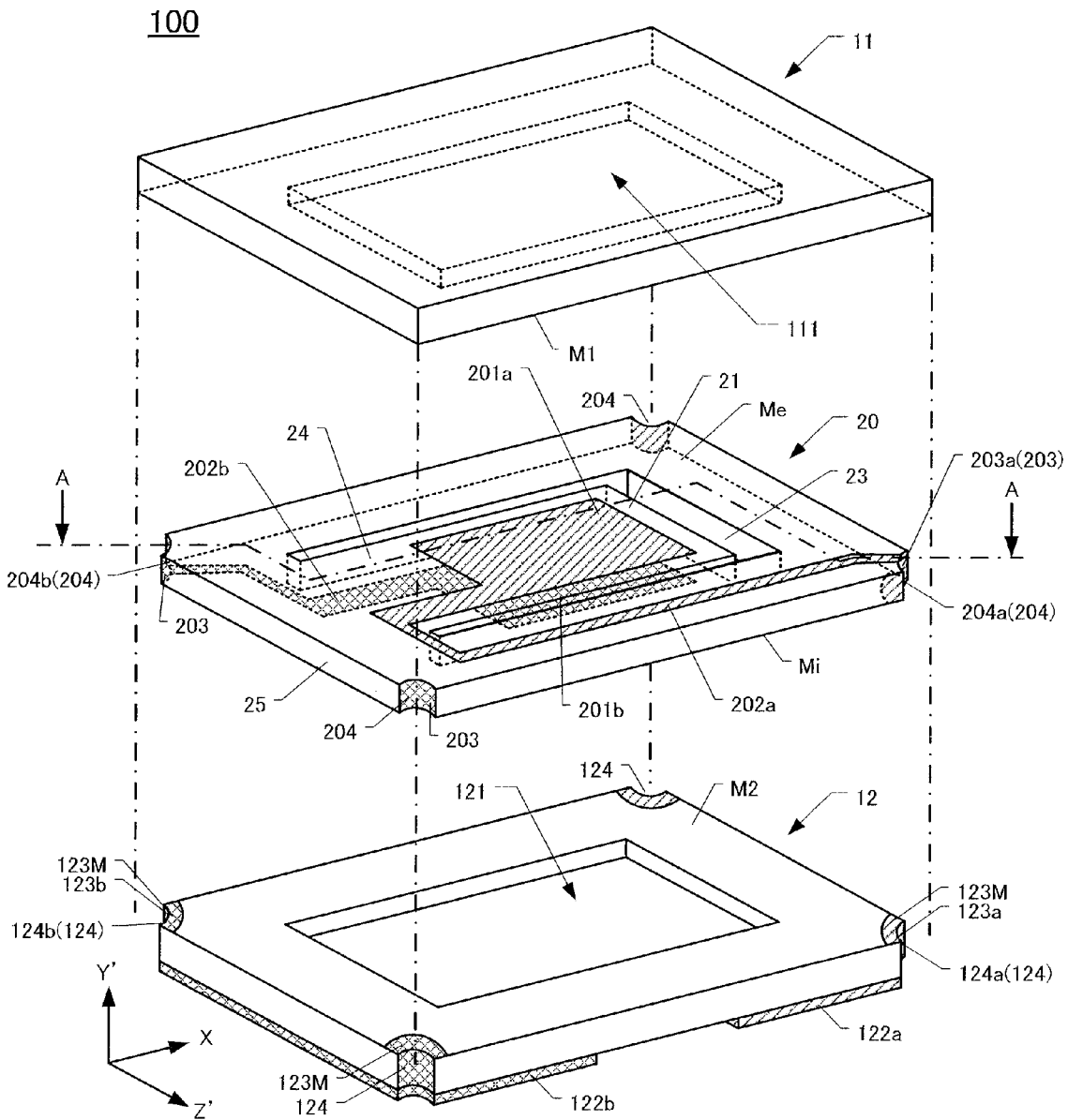
FIG. 1 is an exploded perspective view of the first quartz-crystal vibrating device 100.
Figure 2A:
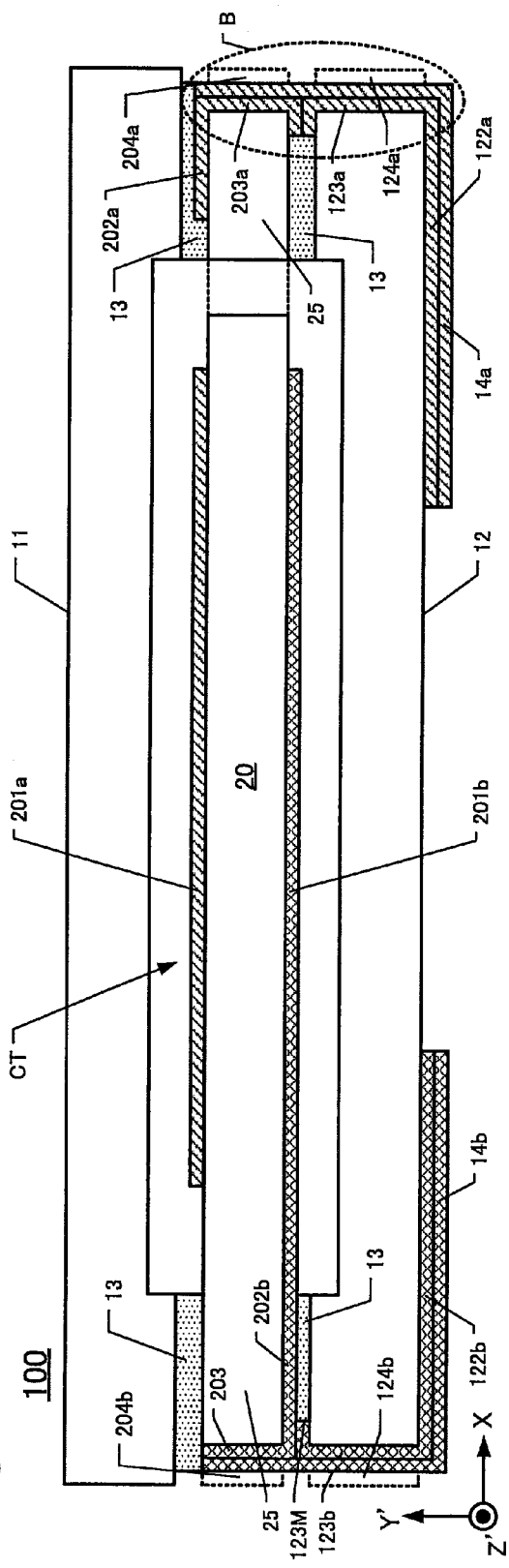
FIG. 2A is a cross-sectional view of the first quartz-crystal vibrating device in FIG. 1, taken along A-A line.
Figure 2B:
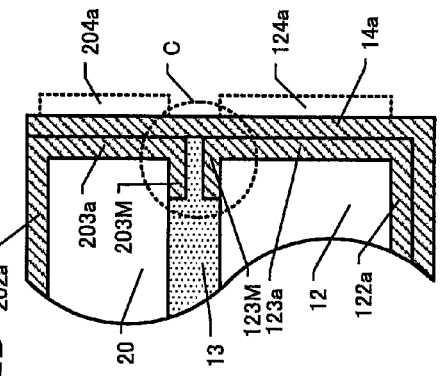
FIGS. 2B, 2C and 2D are enlarged view of dotted line B in FIG. 2A, indicating disconnecting means between the quartz-crystal side surface 203 and the base side surface electrode 123.
Figure 2C:
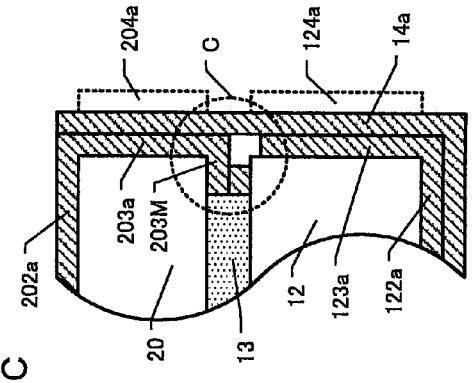
Figure 2D:
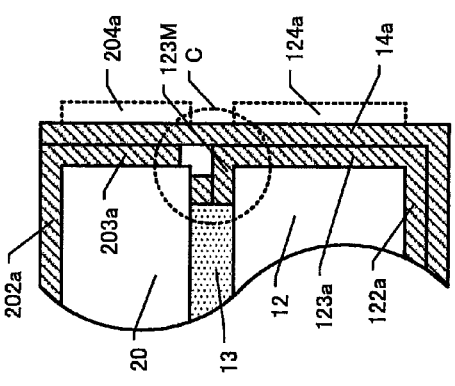

The overall configuration of the first quartz-crystal vibrating device 100 is explained with reference to FIGS. 1 and 2. FIG. 1 is an exploded perspective view of the first quartz-crystal vibrating device 100. In FIG. 1, connection electrodes 14a and 14b, and adhesive 13 are omitted from this figure. FIG. 2A is a cross-sectional view of the FIG. 1 taken along A-A line, and FIGS. 2B, 2C and 2D are enlarged view of dotted line B in FIG. 2A, indicating the disconnection between the quartz-crystal side surface 203 and the base side surface electrode 123.

The first quartz-crystal vibrating device 100 has AT-cut quartz-crystal vibrating piece as quartz-crystal piece. An AT-cut quartz crystal vibrating piece has a principal surface (in the YZ plane) that is tilted by 35° 15' about the Y-axis of the crystal coordinate system (XYZ) in the direction of the Y-axis from the Z-axis around the X-axis. Thus, in the following embodiments, new axes tilted with respect to the axial directions of the quartz-crystal vibrating piece are denoted as the Y'-axis and Z'-axis, respectively. In the first embodiment, the long direction of the first quartz-crystal vibrating device is X-axis, the height (thickness direction) of the first quartz-crystal vibrating device is referred as Y'-axis and the perpendicular direction to Y'-axis direction is referred as Z'-axis, which corresponds to the short direction of the quartz-crystal vibrating device 100.

As shown in FIG. 1, the first quartz-crystal vibrating device 100 includes a rectangular package lid 11 having a lid recess 111, a package base 12 having a base recess 121, and a rectangular quartz-crystal frame 20 that is sandwiched between package lid 11 and package base 12.

The package base 12 is formed of a glass or quartz-crystal material, and the second connection surface M2 is formed surrounding surface (+Y'-axis direction) of the base recess 121.

On four corners of the package base 12, base castellations 124 (124a, 124b) are formed; the base castellations are formed on XZ'-direction plane, and is recessed to form ¼ arch on XZ'-plane. On package base 12, a pair of external electrodes 122a and 122b is formed, on both sides to X-axis direction of the mounting surface (mounting surface of the quartz-crystal vibrating device). On base castellations 124, base side surface electrodes 123 are formed. One end of the base side surface electrodes 123a and 123b connects to the external electrodes 122a and 122b.

Here, it is preferred that the other end of base side surface electrodes 123a and 123b extend to the second connection surface M2 of the package base 12, to form the connection pad 123M. The connection pad 123M is ensured to be electrically connected to the quartz-crystal side surface electrode 203, which will be referenced hereafter.

The quartz-crystal frame 20 is formed by AT-cut quartz-crystal material, bonded to the second connection surface M2 of the package base 12, and has front surface (+Y'-axis direction) Me and back surface (−Y'-axis direction) Mi. The quartz-crystal frame 20 is constituted of the quartz-crystal vibrating device 21 and the outer frame 25 surrounding the quartz-crystal vibrating portion 21. Also, between the quartz-crystal vibrating portion 21 and the outer frame 25, a U-shaped gap portion 23 is formed, which cuts through from the front surface Me to the back surface Mi. The portion without the gap portion 23 is a joining portion 24 between the quartz-crystal vibrating portion 21 and the outer frame 25.

On the front surface Me and back surface Mi of the quartz-crystal vibrating portion 21, excitation electrodes 201a and 201b are formed respectively, and between both surface of the joining portion 24 and outer frame 25, extraction electrodes 202a and 202b are formed, for electrically connecting to the excitation electrodes 201a and 201b. Further, on four corners of the quartz-crystal frame 20, a quartz-crystal castellation 204 (204a and 204b) are formed, which was formed while forming the quartz-crystal cut-through hole CH1 (refer to FIG. 5). The extraction electrode 202b, formed on back surface Mi of the quartz-crystal frame 20, is electrically connected to the base side surface electrode 123b.

On the quartz-crystal castellation 204a, a quartz-crystal side surface electrode 203a is formed, and the quartz-crystal side surface electrode 203a is electrically connected to the extraction electrode 202a and the base side surface electrode 123a. Here, it is preferred that the quartz-crystal side surface electrode 203a extends to the back surface Mi of the quartz-crystal frame 20, to form the connection pad 203M. The connection pad 203M is ensured to be electrically connected to the quartz-crystal side surface electrode 123a.

The first quartz-crystal vibrating device 100 further comprises the package lid 11 that bonds to the front surface Me of the quartz-crystal frame 20, and is made of glass or quartz-crystal material. The package lid 11 includes the first connection surface M1, formed in periphery of the lid recess 111. As shown in FIG. 2A, the package lid 11, the outer frame 25 of the quartz-crystal frame 20 and the package base 12 forms a cavity CT, for storing the quartz-crystal vibrating portion 21. The cavity CT is filed with nitrogen gas or in a vacuum.

The package lid 11, quartz-crystal frame 20 and package base 12 are bonded by nonconductive adhesive 13 (hereinafter referred as adhesive), such as, for example, low-melting-point glass. The sealing glass GS is a lead-free vanadium-based glass having adhesive component, which melts at 350° C. to 400° C. Vanadium-based glass is paste adhesive mixed with binder and solvent, and bonds to other materials by going through the process of burning and cooling. Melting point of vanadium-based glass is lower than the melting point of the package lid 11 and package base 12 formed by quartz-crystal material or glass, and vanadium-based glass provides airtightness and is reliable in resistance against water and humidity. The vanadium-based glass prevents water vapor in atmosphere from entering into the cavity CT or lowering airtightness of cavity CT. Further, the vanadium-based glass controls heat expansion coefficient by controlling glass structure.

As shown in FIG. 2, the first quartz-crystal vibrating device 100 includes the connection electrode 14 (14a and 14b) on outward surface of the base castellation 124 and quartz-crystal castellation 204. The connection electrode 14a is formed in a way that it covers all or part of the external electrode 122a, the base side surface electrode 123a and the quartz-crystal side surface electrode 203a. Also, the connection electrode 14b is formed in a way that it covers all or part of the external electrode 122b, the base side surface electrode 123b and the quartz-crystal castellation 204. Thereby, the external electrodes 122a and 122b are ensured to be electrically connected to the excitation electrodes 201a and 201b through the base side surface electrodes 123a and 123b, the quartz-crystal side surface electrodes 203a and the extraction electrodes 202a and 202b.

For example, as indicated with dotted circle C in FIG. 2B, the quartz-crystal side surface electrode 203a is electrically disconnected on corner of the package base 12. Also, for example, as indicated with dotted circle C in FIG. 2C, the base side surface electrode 123a is electrically disconnected on corner of the quartz-crystal frame 20. Further, for example, as indicated with dotted circle C in FIG. 2D, the adhesive 13 flows into the gap between the connection pad 123M and 203M.

In such cases, since the connection electrode 14a is formed for connecting the base side surface electrode 123a and the quartz-crystal side surface electrode 203a, the external electrode 122a is ensured to be reliably connected to the extraction electrode 202a through the base side surface electrode 123a and the quartz-crystal side surface electrode 203a.

In this first embodiment, although the connection electrodes 14a and 14b are formed on lower side (−Y'-axis direction) of the external electrodes 122a and 122b, the connection electrodes 14a and 14b are not necessary to be formed. Also, an alternating voltage (voltage that alternates positive and negative) is applied to a pair of external electrodes 122a, 122b or connection electrodes 14a and 14b of the first quartz-crystal vibrating device 100. The external electrode 122a, base side surface electrode 123a, connection electrode 14a, quartz-crystal side surface electrode 203a, extraction electrode 202a and excitation electrode 201a have the same polarity, and the external electrode 122b, base side surface electrode 123b, connection electrode 14b, extraction electrode 202b and excitation electrode 201b have the same polarity.

Further, in this first embodiment, although the low-melting-point glass is used as adhesive 13, a polyimide resin can be used instead of low-melting-point glass.

<Manufacturing Method of the First Quartz-Crystal Vibrating Device 100>

Figure 3:
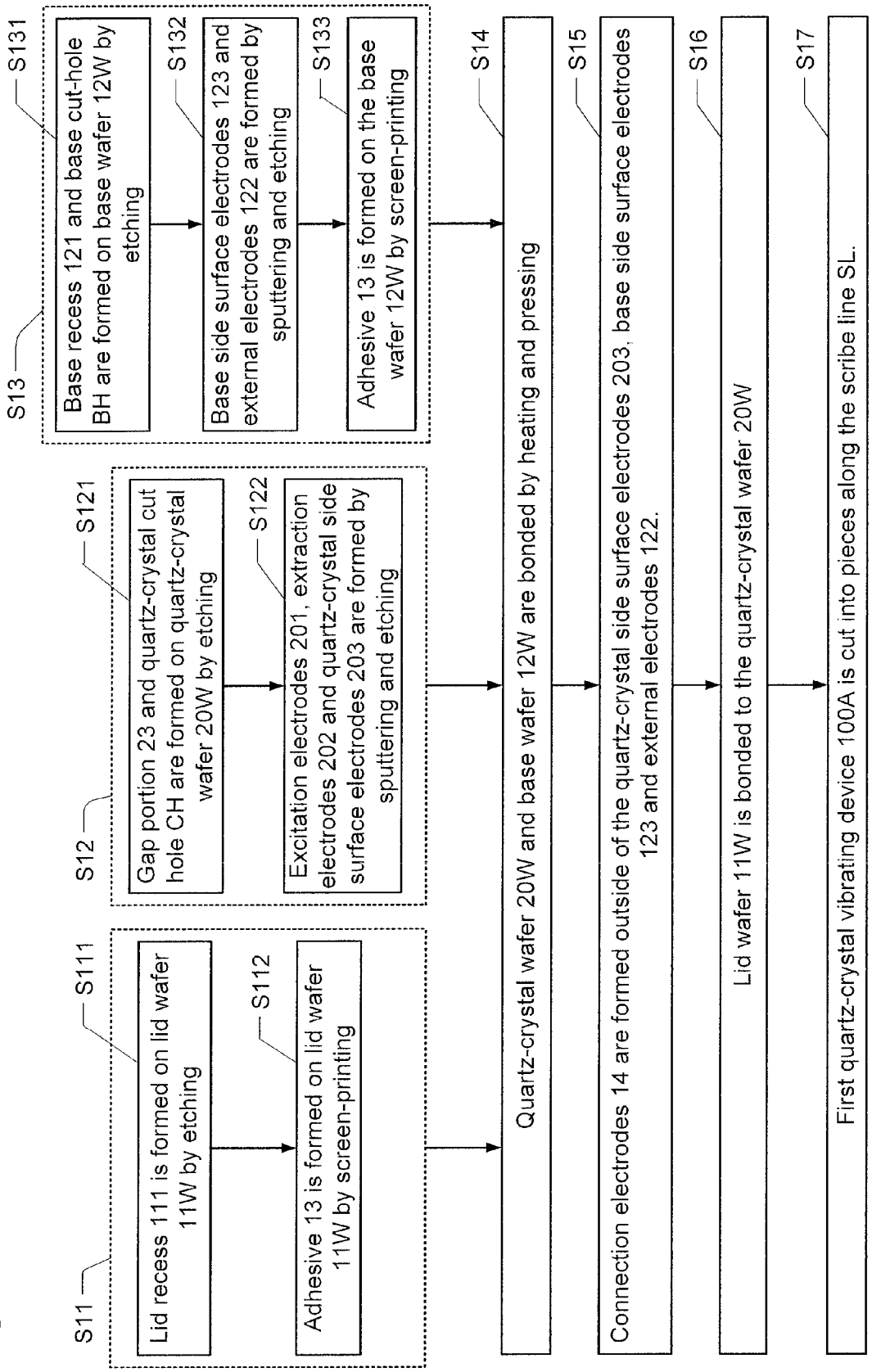
FIG. 3 is a flow chart showing steps of manufacturing the first quartz-crystal vibrating device 100.
Figure 4:
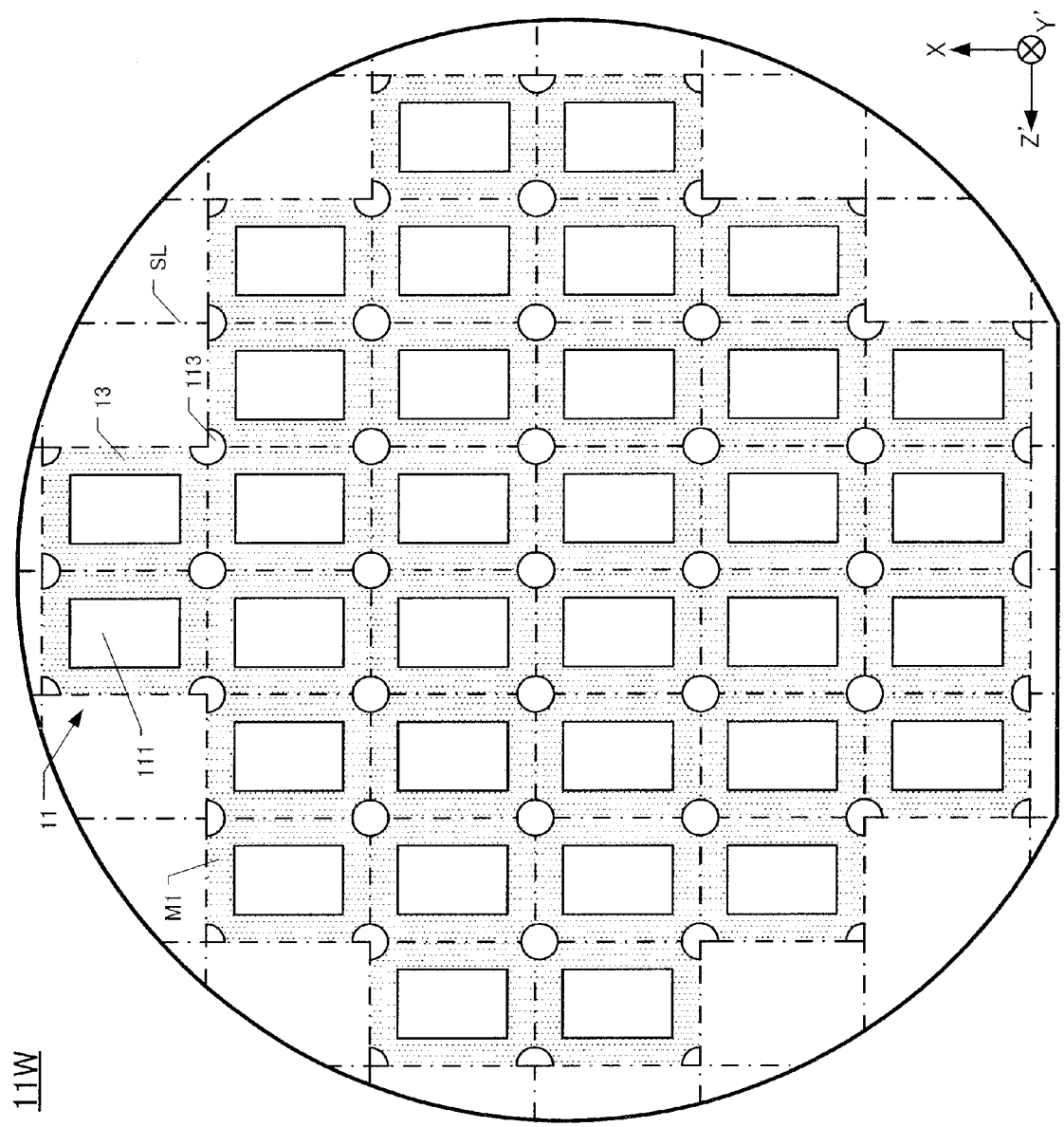
FIG. 4 is a plan view of the lid wafer 11W in the first embodiment.
Figure 5:
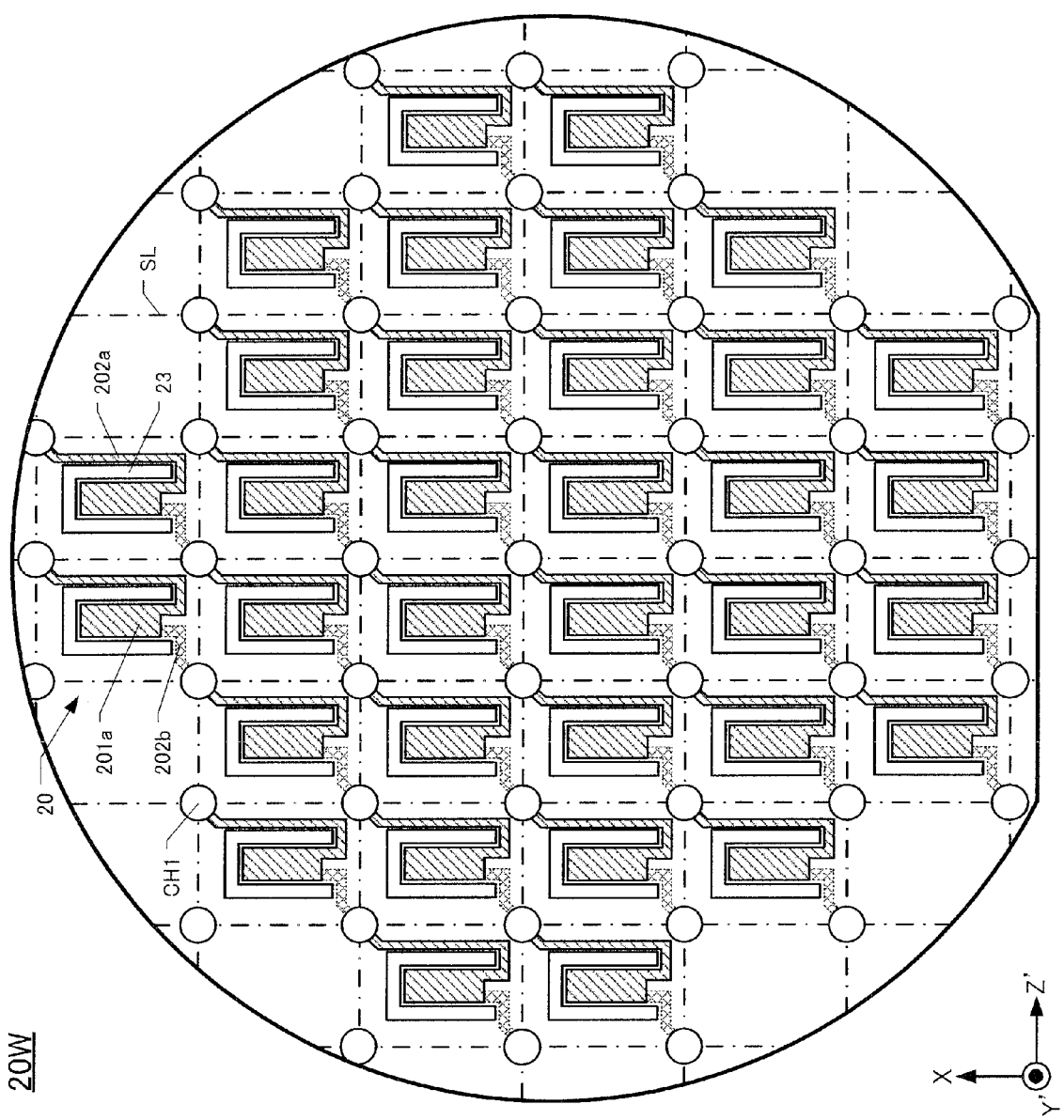
FIG. 5 is a plan view of the quartz crystal wafer 20W in the first embodiment.
Figure 6:
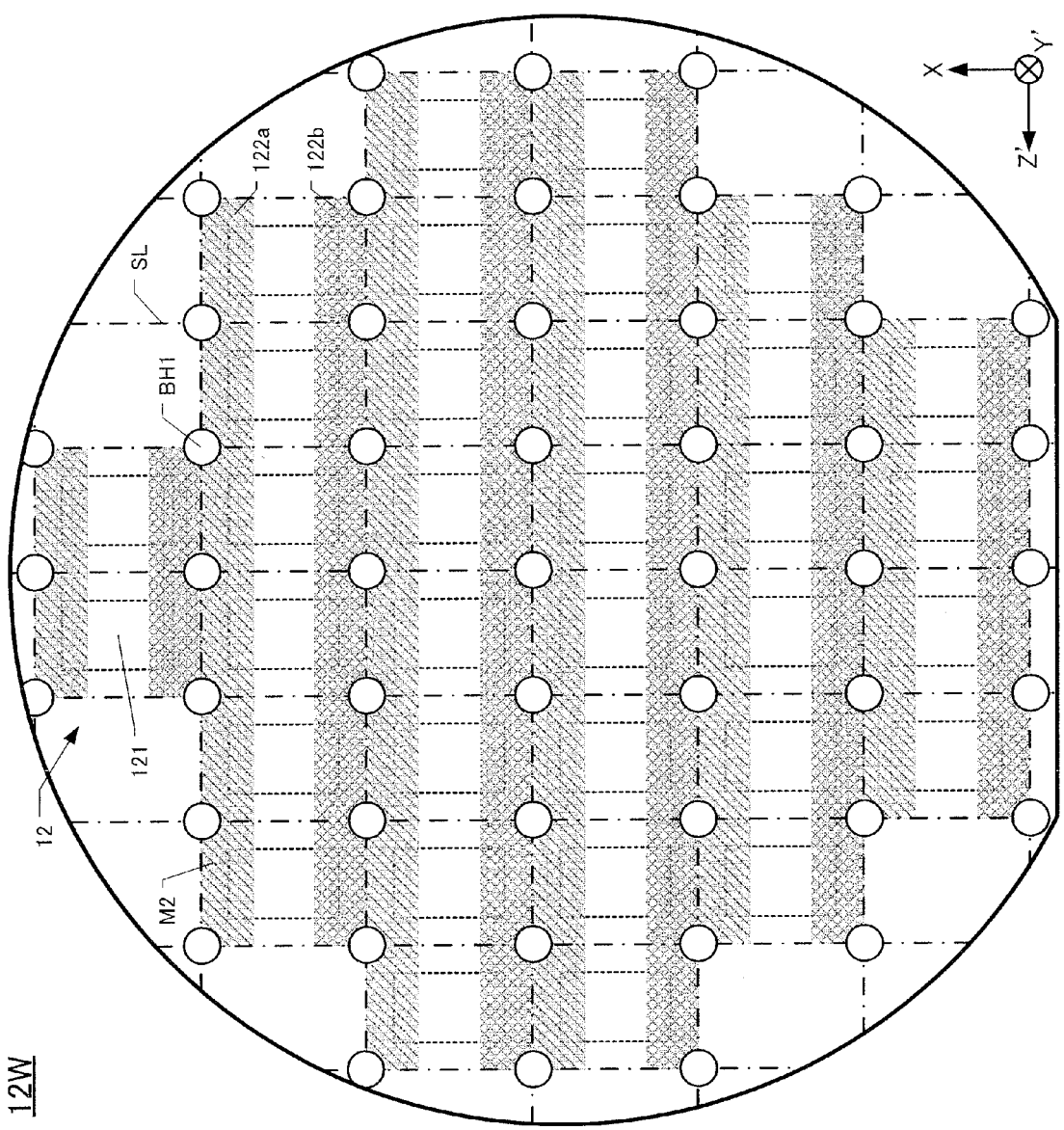
FIG. 6 is a plan view of the base wafer 12W in the first embodiment.

FIG. 3 is a flow chart showing steps of manufacturing the first quartz-crystal vibrating device 100. In FIG. 3, step S11 for manufacturing the package lid 11, step S12 for manufacturing the quartz-crystal frame 20 and the step S13 for manufacturing the package base 12 can be carried out separately or in parallel. FIG. 4 is a plan view of the lid wafer 11W, FIG. 5 is a plan view of the quartz-crystal wafer 20W and FIG. 6 is a plan view of the base wafer 12W of the first embodiment.

In step S11, the package lid 11 is manufactured. Step S11 includes steps S111 and S112. In step S111, as shown in FIG.

4, several hundreds to several thousands of lid recesses 111 are formed on the lid wafer 11W, a uniformly thick and planar plate of quartz-crystal material. On the lid wafer 11W, the lid recess 111 is formed by etching or mechanical processing, and the first connection surface M1 is formed surrounding the lid recess 111.

In step S112, as shown in FIG. 4, the low-melting-point glass, which is used as an adhesive 13, is formed on the first connection surface M1 of the lid wafer 13 by screen-printing. Then by going through the preliminary curing on the low-melting-point glass, the low-melting-point glass film is formed on the first connection surface M1 of the lid wafer 11W. The low-melting-point glass film is not formed on the corresponding position 113 of the quartz-crystal cut-hole CH1 (quartz-crystal castellation 204).

In step S12, the quartz-crystal frame 20 is manufactured. Step S12 includes steps S121 and S122.

In step S121, as shown in FIG. 5, a plurality of exterior shape of the quartz-crystal frame 20 is formed on a planar quartz-crystal wafer 20W by etching. This way, the quartz-crystal vibrating portion 21, the outer frame 25 and the gap portion 23 are formed all at once. At the same time, on four corners of each quartz-crystal frame 20, a circular quartz-crystal cut-hole CH1 is formed, in a way it cuts through the quartz-crystal wafer 20W. When the quartz-crystal cut-hole CH1 is divided into four sections, one quartz-crystal castellation 204 (refer to FIG. 1) is formed.

In step S122, a metal layer is formed on both surface of the quartz-crystal wafer 20W and the quartz-crystal cut-hole CH1 by sputtering or vacuum-deposition. Then, photoresist is applied uniformly on entire surface of the metal layer. Using exposure tool (not shown), patterns of excitation electrodes 201a and 201b, extraction electrodes 202a and 202b and quartz-crystal side surface electrodes 203a are exposed on the quartz-crystal wafer 20W. Then, gold layer, exposed from photoresist, is etched. Accordingly, excitation electrodes 201a and 201b, extraction electrodes 202a and 202b are formed on both surface of the quartz-crystal wafer 20W, and the quartz-crystal side surface electrodes 203 is formed on the quartz-crystal cut-hole CH1 (refer to FIG. 1 and FIG. 2).

In step S13, the package base 12 is manufactured. Step S13 includes steps S131 to S133.

In step S131, as shown in FIG. 6, a plurality of the base recesses 121 are formed on a planar quartz-crystal base wafer 12W. On the base wafer 12W, the base recess 121 is formed by etching or mechanical processing, and the second connecting portion M2 is formed in periphery of the base recess 121. At the same time, on four corners of each base wafer 12W, a circular base cut-hole BH1 is formed, in a way it cuts through the base wafer 12W. When the base cut-hole BH1 is divided into four sections, one quartz-crystal castellation 124 (refer to FIG. 1) is formed on each base.

In step S132, as shown in FIG. 6, a pair of external electrodes 122a and 122b are formed on mounting surface of the package base 12 by sputtering and etching of step S122. At the same time, the base side surface electrode 123 is formed on the base cut-hole BH1 (refer to FIG. 1 and FIG. 2). In step S133, the low-melting-point glass is formed as adhesive 13, on the second connection surface M2 of the base wafer 12W by screen-printing. Then, the low-melting-point glass is formed on the second connection surface M2 of the base wafer 12W by temporary hardening the low-melting-point glass. In step S14, adhesive 13 is heated and the quartz-crystal wafer and base wafer 12W are pressed against each other. The quartz-crystal wafer 20W and the base wafer 12W are bonded by adhesive 13.

In step S15, a pair of connection electrodes 14a and 14b are formed, in a way that it covers the external electrode 122a and 122b, base side surface electrodes 123 and quartz-crystal side surface electrode 203. This means, bonded quartz-crystal wafer 20W and base wafer 12W are mounted on the table (not drawn) in a way that the quartz-crystal wafer 20W is facing downward. Then, masks (not drawn) are disposed on the device side of the base wafer 12W, on a corresponding region of the external electrodes 122a and 122b and the base cut-hole BH1.

The connection electrodes 14a and 14b are formed by sputtering and vacuum-deposition. The base side surface electrode 123, formed in step S132, and the quartz-crystal side surface electrode 203, formed in step S122 (refer to FIGS. 2B, 2C and 2D) are ensured to be electrically connected.

In step S16, adhesive 13 is heated and the lid wafer 11W and quartz-crystal wafer 20W are pressed against each other. Then, the lid wafer 11W is bonded to the front surface Me of the quartz-crystal wafer 20W by adhesive 13.

In step S17, lid wafer 11W, quartz-crystal wafer 20W and base wafer 12W bonded together is separated into individual first quartz-crystal vibrating device. In the cutting process, individual first quartz-crystal vibrating devices 100A are produced by cutting the wafer along scribe lines SL, denoted by dot-dash lines in FIG. 4, FIG. 5 and FIG. 6, using a dicing unit such as a laser beam or a dicing saw. Thus, several hundreds to several thousands of first quartz-crystal vibrating devices 100A are produced, each producing an accurate vibration frequency.

According to the manufacturing method of the first quartz-crystal vibrating device 100 explained in FIG. 3, although adhesive 13 is formed on the lid wafer 11W and base wafer 12W before bonding together, it can be formed on both side of the quartz-crystal wafer 20W. Also, when polyimide resin is used as adhesive 13, the polyimide can be formed by screen-printing, or if photosensitive polyimide resin is used, adhesive 13 can be formed on the connection surface M by exposure method.

Second Embodiment
<Overall Configuration of the Second Quartz-Crystal Vibrating Device 200>

Figure 7:
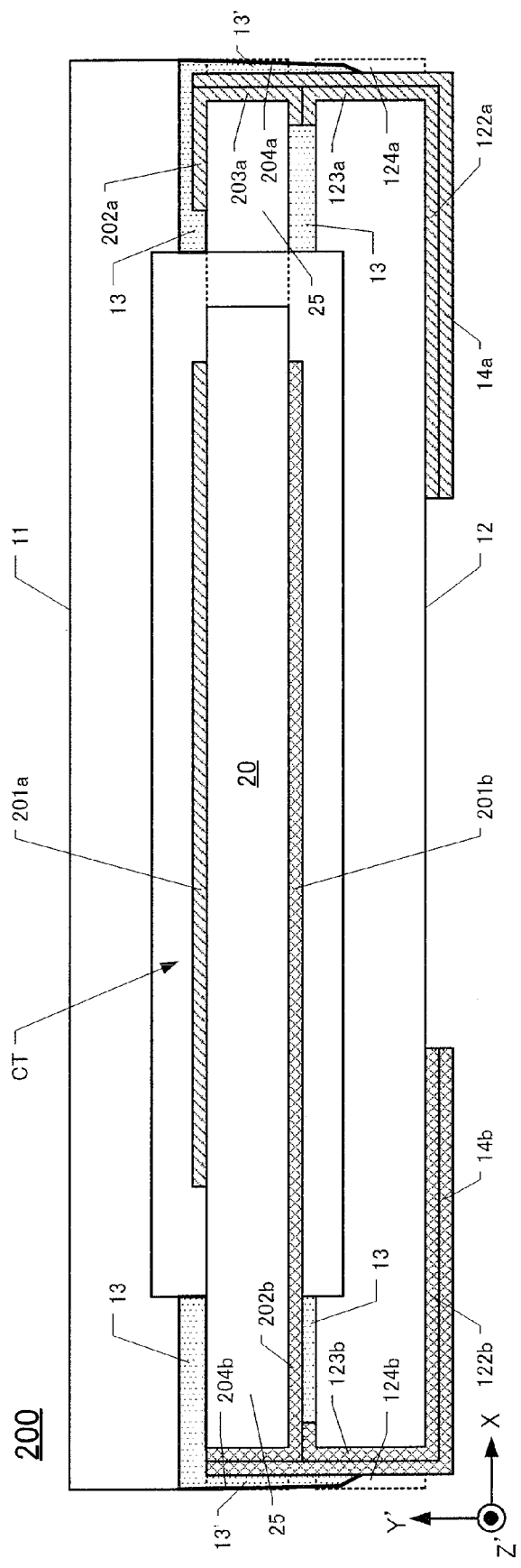
FIG. 7 is a cross-sectional view of the second quartz-crystal vibrating device 200 in the second embodiment, which is taken along the same A-A line as taken in FIG. 1.

FIG. 7 is a cross-sectional view of the second quartz-crystal vibrating device 200 in this second embodiment, which is taken along the same A-A line as taken in FIG. 1. In this embodiment, components that are similar to corresponding components in the first embodiment have the same respective reference numerals.

As shown in FIG. 7, the second quartz-crystal vibrating device 200 has almost same configuration as the first quartz-crystal vibrating device 100 explained in the first embodiment. However, in the second quartz-crystal vibrating device 200, the adhesive 13 for bonding the package lid 11 and quartz-crystal frame 20 covers the connection electrodes 14a and 14b. Hereinafter, the adhesive 13 for covering the connection electrodes 14a and 14b is referred as adhesive 13'.

As shown in step S112 in FIG. 3, the adhesive 13 is formed on the first connection surface M1 of the lid wafer 11W by screen-printing. In the first embodiment, the adhesive 13 is not formed on the position 113 corresponding to the quartz-crystal cut-hole CH1 (quartz-crystal castellation 204); however, in this second embodiment, the adhesive 13 is formed on entire surface of the first connection surface M1. Also, the adhesive 13 is formed thicker than on the first embodiment.

As shown in step S16 in FIG. 3, when adhesive 13 is heated and the lid wafer 11W and quartz-crystal wafer 20W are pressed against each other, melted adhesive 13 flows into the quartz-crystal castellation 204 and base castellation 124. The adhesive 13' hardens when the adhesive 13', which covers the connection electrodes 14a and 14b, is cooled down to room temperature.

Since the adhesive 13' covers the connection electrodes 14a and 14b and protects thereof, the adhesive 13' prevents the external electrodes 122a and 122b, excitation electrodes 201a and 201b from disconnection. Further, the presence of adhesive 13' provides impact resistance.

Third Embodiment

<Overall Configuration of the Third Quartz-Crystal Vibrating Device 300>

Figure 8:
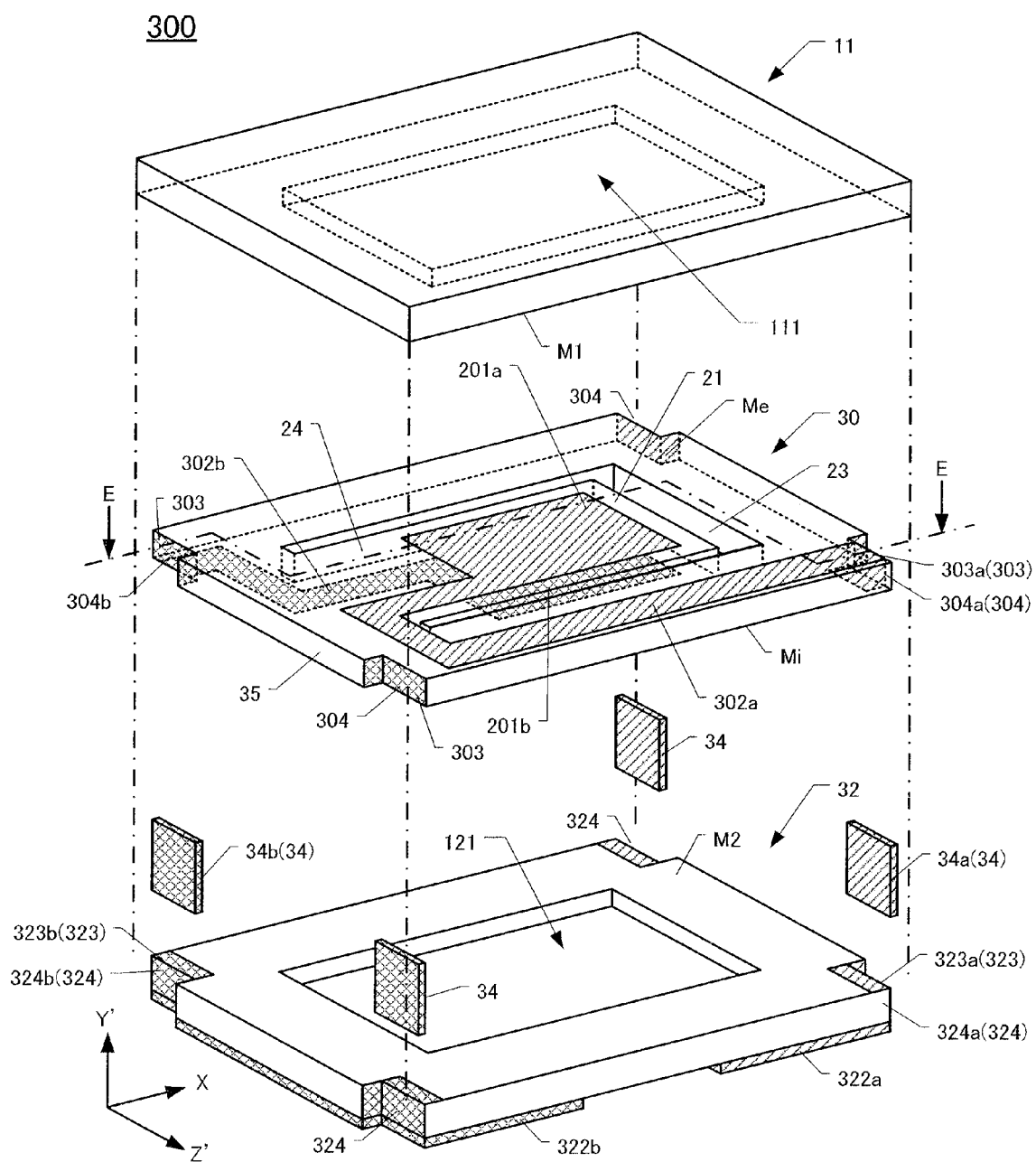
FIG. 8 is an exploded perspective view of the third quartz-crystal vibrating device 300 without adhesive 13.

FIG. 8 is an exploded perspective view of the third quartz-crystal vibrating device 300 without adhesive 13. In this embodiment, components that are similar to corresponding components in the first embodiment have the same respective reference numerals.

As shown in FIG. 8, the third quartz-crystal vibrating device 300 includes a package lid 11, a rectangular package base 32 having a base recess 121, and a rectangular quartz-crystal frame 30 that is sandwiched between the package lid 11 and package base 32. On four corners of the quartz-crystal frame 30, rectangular quartz-crystal castellations 304 are formed along XZ'-plane, extending toward Z'-axis direction, which is formed while forming quartz-crystal cut-hole CH3 (refer to FIG. 9) on four respective corners. This is because, when etching the quartz-crystal using etchant, the speed of etching varies depending on the direction of the direction of crystallization. Thus, since quartz-crystal have a difficulty in etching toward X-axis direction, it is preferred that the quartz-crystal to be etched toward Z'-axis direction, which is vertical direction to X-axis direction.

Further, the quartz-crystal castellation 304 is extending toward Z'-axis direction along XZ'-plane. Thereby, the extraction electrode 302a and quartz-crystal side surface electrode 303a, formed on outer frame 35, are ensured to be electrically connected with greater width. In this third embodiment, the package base 32 is formed by quartz-crystal.

On four corners of the package base 32, the base castellations 324 are formed along XZ'-plane, extending toward Z'-axis direction, which is a corresponding position to the quartz-crystal castellations 304 of the quartz-crystal frame 30. Here, since the base castellation 324 is extending to Z'-axis direction along the XZ'-plane, external electrodes 322a and 322b are ensured to be electrically connected to the base side surface electrodes 323a and 323b with greater width. In other words, rectangular-shaped castellations 324 ensure greater width for contact between metal plates than circular-shaped castellation, thus provides better conductivity.

Also, on the third quartz-crystal vibrating device 300, connection electrodes 34 are formed in a way that it covers the base side surface electrode 323 of the base castellation 324 and the quartz-crystal side surface electrode 303 of the quartz-crystal castellation 304. Here, the connection electrode 34a connects the base side surface electrode 323a and the quartz-crystal side surface electrode 303a, and the connection electrode 34b connects the base side surface electrode 323b and the quartz-crystal side surface electrode 303b (extraction electrode 302b). Accordingly, extraction electrodes 322a and 322b are ensured to be electrically connected to the excitation electrodes 201a and 201b. Here, although the connection electrodes 34 are formed in a way that it only covers the base side surface electrodes 323 and the quartz-crystal side surface electrodes 303, it can cover all or part of the external electrodes 322a and 322b.

Further, as explained in the second embodiment, in the third quartz-crystal vibrating device 300, connection electrodes 34 can be covered by the adhesive 13, which was used for bonding the package lid 11 and the quartz-crystal frame 30. In this configuration, the adhesive 13' protects the connection electrode 34 and increases impact resistance.

<Manufacturing Method of the Third Quartz-Crystal Vibrating Device 300>

Figure 9:
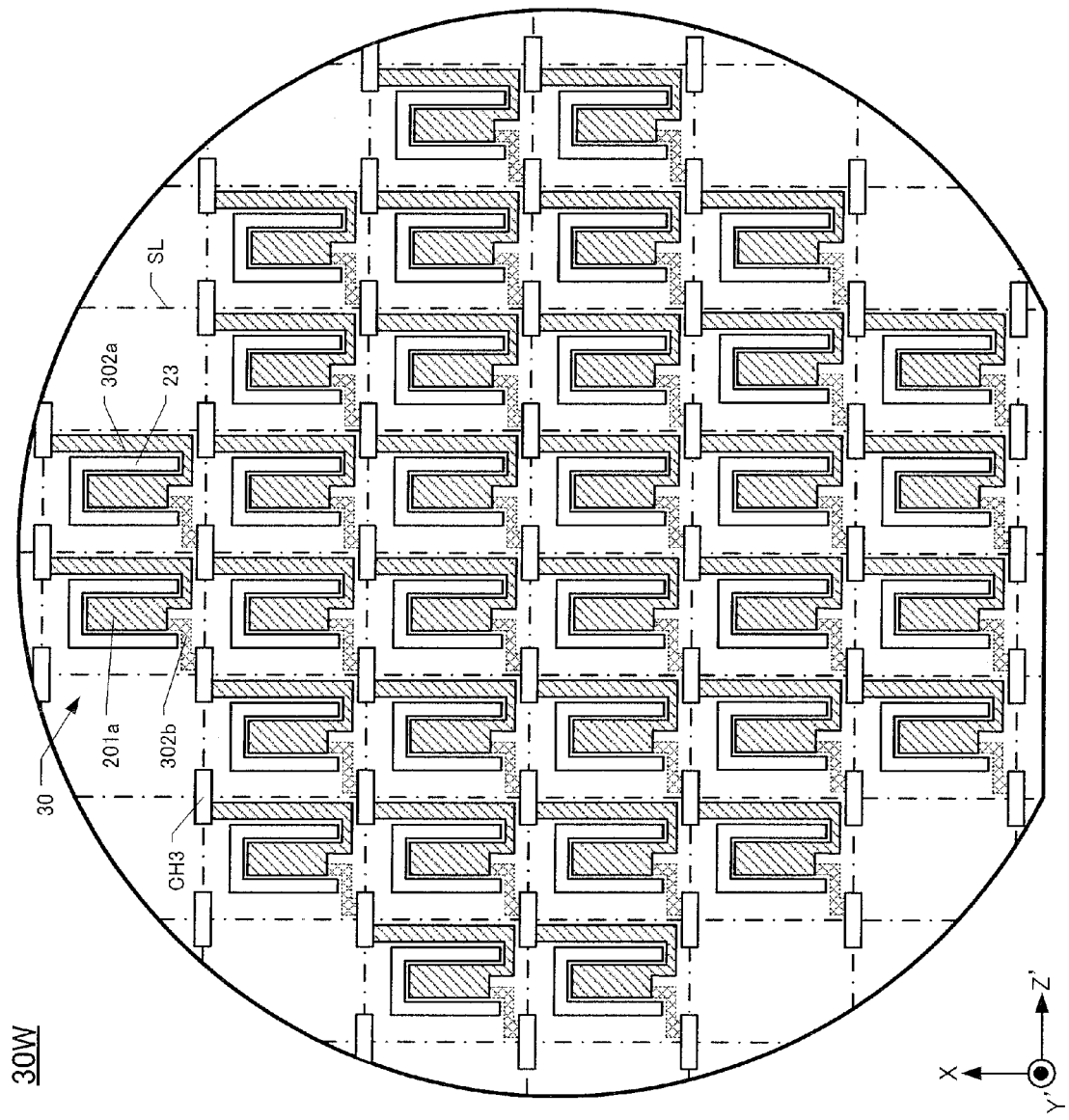
FIG. 9 is a plan view of the quartz-crystal wafer 30W in the third embodiment.

Manufacturing method of the third quartz-crystal vibrating piece 300 follows the same manufacturing method as described in FIG. 3 of the first embodiment. However, shape of the cut-hole of the quartz-crystal wafer 30W and the base wafer (not drawn) are different from the previous embodiment. FIG. 9 is a plan view of the quartz-crystal wafer 30W in the third embodiment.

As shown in FIG. 9, on each corner of each quartz-crystal frame 30, a quartz-crystal cut-hole CH3 is formed, a rectangular cut-hole extending toward Z'-axis direction that cuts through the quartz-crystal wafer 30W. When the quartz-crystal cut-hole CH3 is divided into four sections, one quartz-crystal castellation 304 (refer to FIG. 8) is formed. Although the explanation regarding the base wafer is omitted in this embodiment, as shown in FIG. 9, a base cut-hole (not shown) is formed on each corner of the package base 32, on corresponding positions to the quartz-crystal wafer 30W. When the base cut-hole is divided into four sections, one base castellation 324 (refer to FIG. 8) is formed on each base.

Alternative to Third Embodiment

<Overall Configuration of Third Quartz-Crystal Vibrating Device 300'>

Figure 10:
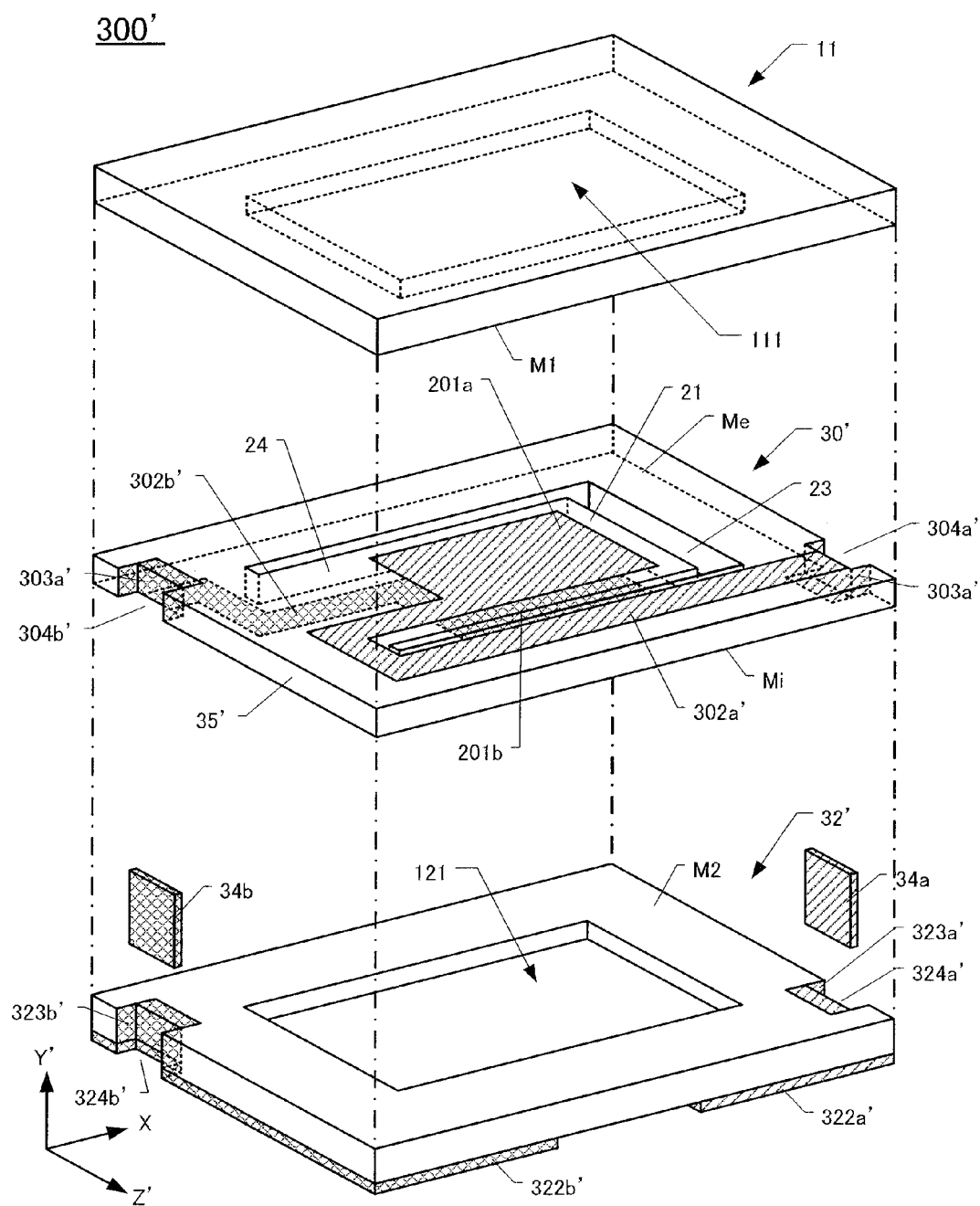
FIG. 10 is an exploded perspective view of the third quartz-crystal vibrating device 300' in the alternative to third embodiment without adhesive 13.

FIG. 10 is an exploded perspective view of the third quartz-crystal vibrating device 300' in the alternative to third embodiment without adhesive 13. In this embodiment, components that are similar to corresponding components in the third embodiment have the same respective reference numerals.

As shown in FIG. 10, the third quartz-crystal vibrating device 300' includes the package lid 11, package base 32' and quartz-crystal frame 30' that is sandwiched between the package lid 11 and package base 32'.

On the quartz-crystal frame 30', rectangular quartz-crystal castellations 304a' and 304b' are formed along XZ'-plane, on both sides of quartz-crystal cut-holes CHa and CHb (refer to FIG. 11), extending toward Z'-axis direction. Here, the quartz-crystal castellations 304a' and 304b' are disposed on both distal ends of Z'-axis direction of the center line (not drawn) of the quartz-crystal frame 30' extending toward X-axis direction. Length of the quartz-crystal castellations 304a' and 304b' to Z'-axis direction is about 0.4 mm.

On both sides of the package base 32' to X-axis direction, the base castellations 324a' and 324b' are formed on XZ'-plane, on both sides of the base cut-holes BHa and BHb (refer to FIG. 1 and FIG. 2), extending toward Z'-axis direction, in corresponding position to the quartz-crystal castellations 304a' and 304b' of the quartz-crystal frame 30'. Here, the base castellations 324a' and 324b' are disposed on both distal ends to Z'-axis direction of the center line (not drawn) of the package base 32' extending toward X-axis direction.

On the third quartz-crystal vibrating device 300', connection electrodes 34a and 34b are formed in a way that it covers the base side surface electrodes 323a' and 323b' of the base castellations 324a' and 324b', and quartz-crystal side surface electrodes 303a' and 303b' of the quartz-crystal castellations 304a' and 304b'. Here, the connection electrodes 34a connects the base side surface electrodes 323a' and quartz-crystal side surface electrodes 303a', and the connection electrodes 34b connects the base side surface electrodes 323b' and quartz-crystal side surface electrodes 303b' (extraction electrode 302b'). Thus, the external electrodes 322a' and 322b' are ensured to be electrically connected to the excitation electrodes 201a and 201b through extraction electrodes 302a' and 302b'. In other words, rectangular-shaped base castellations 324a' and 324b' ensure greater width for contact between metal plates than circular-shaped castellation, thus provides better conductivity.

Here, although the connection electrodes 34a and 34b are formed in a way that it only covers the base side surface electrodes 323a' and 323b', and quartz-crystal side surface electrodes 303a' and 303b', it can cover all or part of the external electrodes 322a' and 322b'.

<Manufacturing Method of the Third Quartz-Crystal Vibrating Device 300'>

Figure 11:
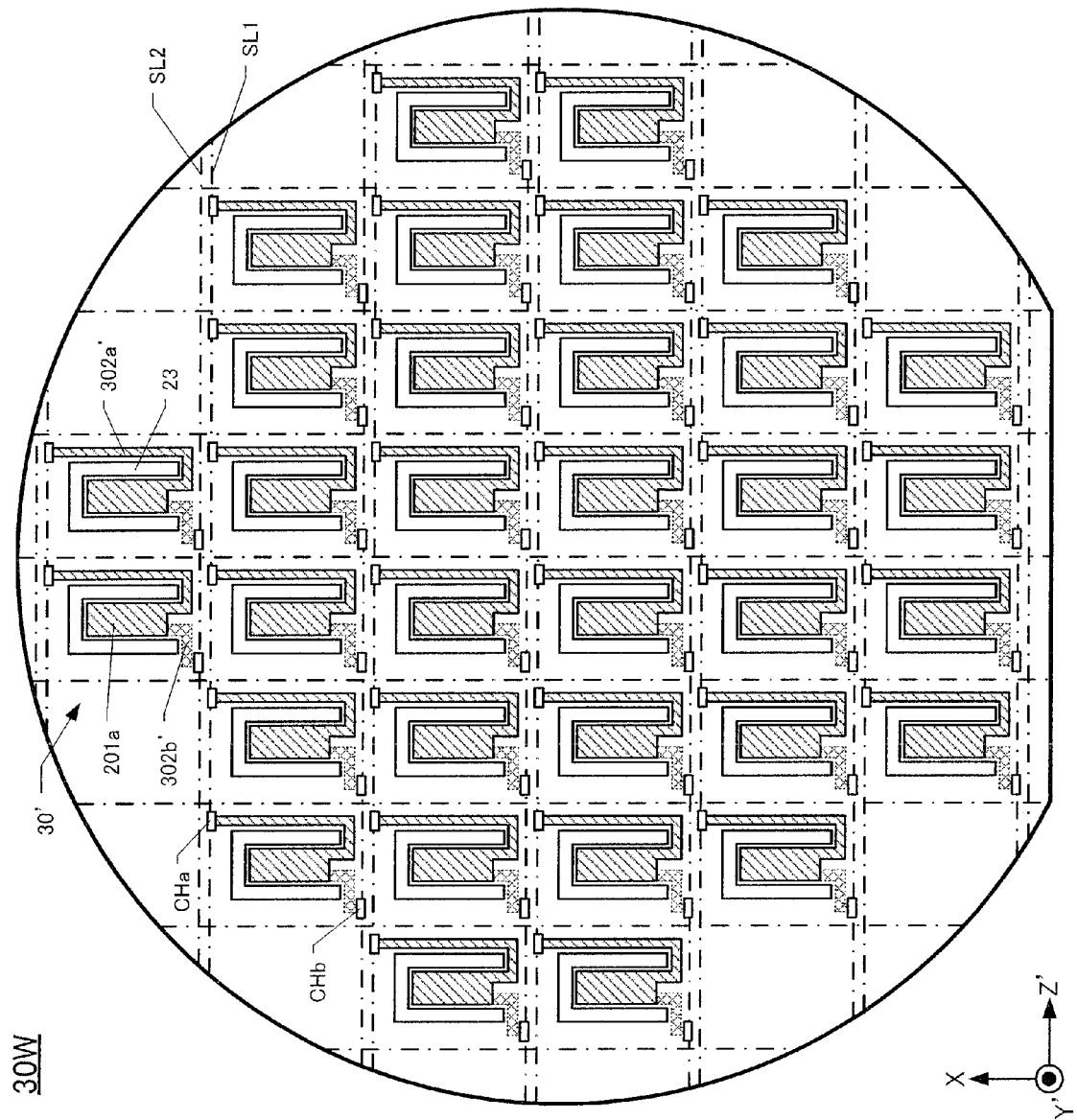
FIG. 11 is a plan view of the third quartz-crystal wafer 30W in the alternative to the third embodiment.

Manufacturing method of the third quartz-crystal vibrating piece 300' follows the same manufacturing method as described in FIG. 3 of the first embodiment. However, shape of the cut-hole of the quartz-crystal wafer 30W and base wafer 32W is different from the previous embodiment. FIG. 11 is a plan view of the quartz-crystal wafer 30W, and FIG. 12 is a plan view of the base wafer 32W in the alternative to the third embodiment.

Figure 12:
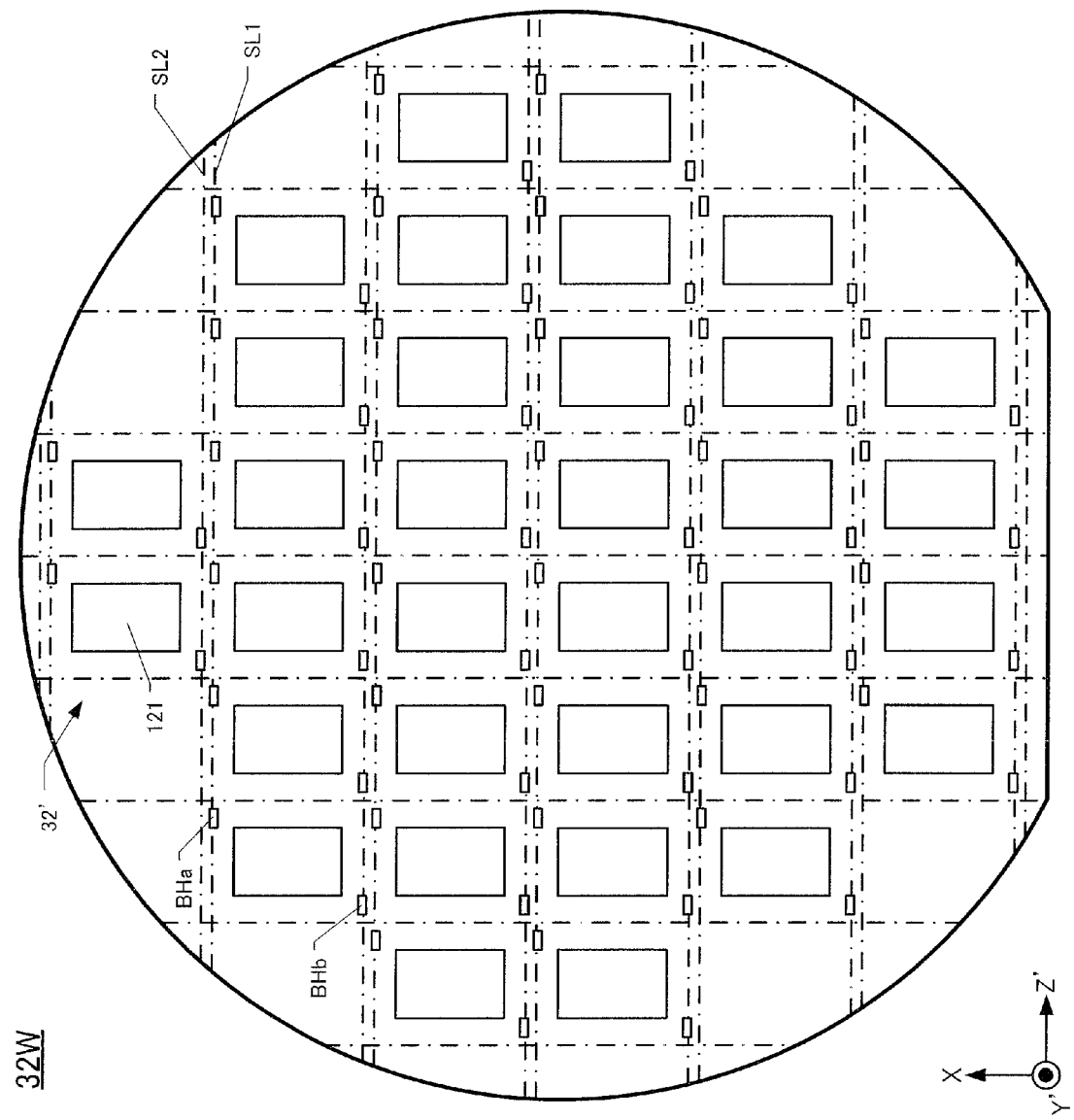
FIG. 12 is a plan view of the third base wafer 32W in the alternative to the third embodiment.

As shown in FIG. 11 and FIG. 12, quartz-crystal cut-hole CHa and the base cut-hole BHa are formed on +Z'-axis side to +X-axis direction of the quartz-crystal frame 30' or package base 32', and quartz-crystal cut-hole CHb and base cut-hole BHb are formed on −Z'-axis side to −X-axis direction of the quartz-crystal frame 30' or package base 32'. Also, adjacent quartz-crystal cut-holes CHa and CHb and adjacent quartz-crystal cut-holes BHa and BHb are formed apart in X-axis direction.

According to this configuration, in step S17 of FIG. 3, the scribe line SL1 passes through the quartz-crystal cut-hole CHa and base cut-hole BHa only, and the scribe line SL2 passes through the quartz-crystal cut-hole CHb and base cut-hole BHb only. Thereby, the third quartz-crystal vibrating device is manufactured as shown in FIG. 10.

Fourth Embodiment

<Overall Configuration of Fourth Quartz-Crystal Vibrating Device 400>

Figure 13:
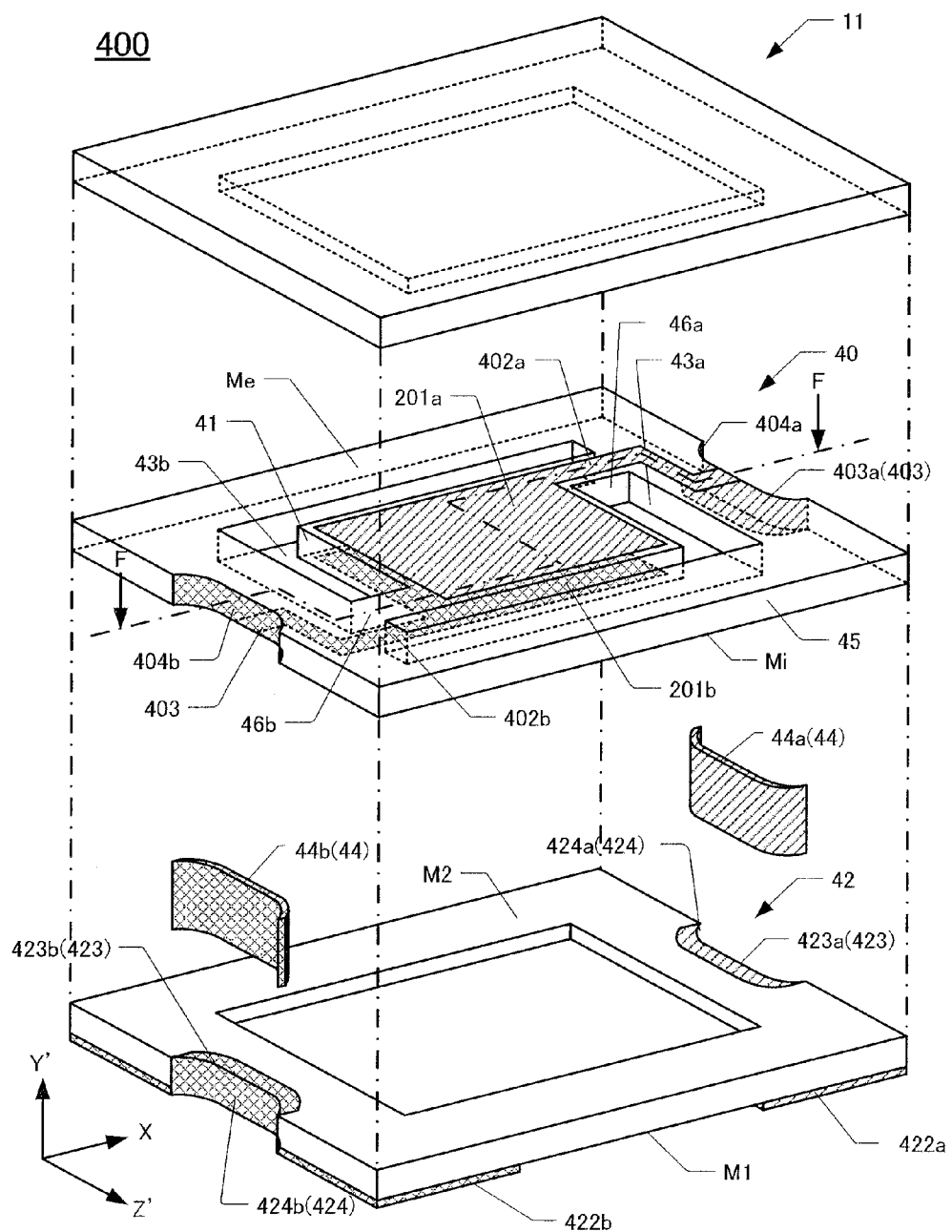
FIG. 13 is an exploded perspective view of the fourth quartz-crystal vibrating device 400 without adhesive 13.

Overall configuration of the fourth quartz-crystal vibrating device 400 is explained using FIG. 13 as reference. FIG. 13 is an exploded perspective view of the fourth quartz-crystal vibrating device 400 in the fourth embodiment without adhesive 13. In this embodiment, components that are similar to corresponding components in the third embodiment have the same respective reference numerals.

As shown in FIG. 13, the fourth quartz-crystal vibrating device 400 includes the package lid 11, package base 42 having the base recess 121 and rectangular quartz-crystal frame 40 that is sandwiched between the package lid 11 and package base 42. Quartz-crystal frame 40 includes a quartz-crystal vibrating portion 41 having excitation electrodes 201a and 201b on both surface, and outer frame 45 that surrounds the quartz-crystal vibrating portion 41. Between the quartz-crystal vibrating portion 41 and outer frame 45, a pair of joining portion 46a and 46b joins the quartz-crystal vibrating portion 41 to the outer frame 45 along X-axis direction on both sides. Thereby, between the quartz-crystal vibrating portion 41 and the outer frame 45, two "L-shaped" gap portions 43a and 43b are formed. Along both sides of the quartz-crystal frame 40 disposed on X-axis direction, extending toward Z'-axis direction, quartz-crystal castellations 404a and 404b are formed, which was formed when forming the rounded rectangular quartz-crystal cut-hole CH4 (refer to FIG. 14). Quartz-crystal side surface electrode 403 is formed on the quartz-crystal castellation 404.

On the joining portion 46a and front surface Me of the outer frame 45, an extraction electrode 402a is formed, which was extracted from the excitation electrode 201a and connects to the quartz-crystal side surface electrode 403a of the quartz-crystal castellation 404a, and on the joining portion 46b and back surface Mi of the outer frame 45, an extraction electrode 402b (quartz-crystal side surface electrode 403b) is formed, which was extracted from the excitation electrode 201b and connects to the base side surface electrode 423b of the base castellation 424b. On the package base 42, a pair of external electrodes 422a and 422b is formed on both sides to X-axis direction. Along both sides of the package base 42 disposed along X-axis direction, base castellations 424a and 424b are formed, which was formed when forming the rounded rectangular base cut-hole (not drawn), on a corresponding position to the quartz-crystal castellations 404a and 404b of the quartz-crystal frame 40.

Also, on the base castellation 424a, a base side surface electrode 423a is formed, in which one end is connected to the external electrode 422a and the other end is connected to the quartz-crystal castellation 404a of the quartz-crystal frame 40. On the base castellation 424b, a base side surface electrode 423b is formed, in which one end is connected to the external electrode 422b and the other end is connected to the extraction electrode 402b of the quartz-crystal frame 40. Thereby, excitation electrodes 201a and 201b are connected to the external electrodes 422a and 422b, formed on the mounting surface of the fourth quartz-crystal vibrating device 400, through the extraction electrodes 402a and 402b, quartz-crystal electrode 403a and base side surface electrodes 423a and 423b.

Also, on the fourth quartz-crystal vibrating device 400, connection electrodes 44 are formed on the base side surface electrode 423 of the base castellation 424, and quartz-crystal side surface electrode 403 of the quartz-crystal castellation 404.

Here, the connection electrode 44a connects the base side surface electrode 423a and quartz-crystal side surface electrode 403a, and the connection electrode 44b connects the base side surface electrode 423b and extraction electrode 402b (quartz-crystal side surface electrode 403b). Thereby, the external electrodes 422a and 422b are ensured to be electrically connected to the excitation electrodes 201a and 201b.

Further, as explained in the second embodiment, in the fourth quartz-crystal vibrating device 400, a connection electrode 44 can be covered by the adhesive 13, which was used for bonding the package lid 11 and the quartz-crystal frame 40. In this configuration, the adhesive 13' protects the connection electrode 44.

<Manufacturing Method of the Fourth Quartz-Crystal Vibrating Device 400>

Figure 14:
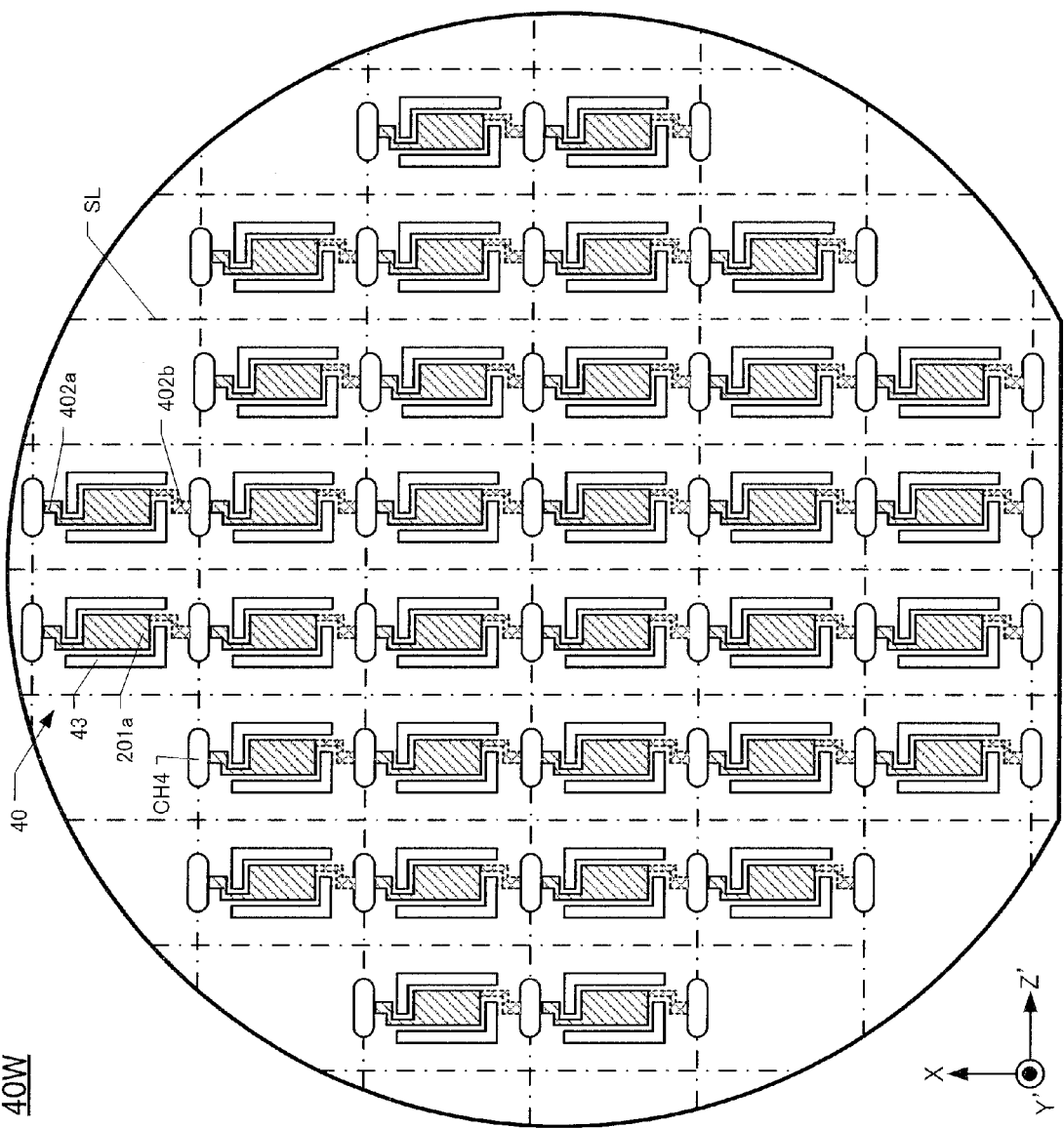
FIG. 14 is a plan view of the quartz-crystal wafer 40W in the fourth embodiment.

The manufacturing method of the fourth quartz-crystal vibrating device 400 follows same step as explained on the flow chart in FIG. 3. However, the shape of the cut-hole of the quartz-crystal wafer 40W and base wafer (not drawn) is different. FIG. 14 is a plan view of the quartz-crystal wafer 40W in the fourth embodiment.

As shown in FIG. 14, a rounded rectangle cut-hole CH4 is formed on both sides of each quartz-crystal frame 40 to X-axis direction, in a way it cuts through the quartz-crystal wafer 40W. When the quartz-crystal cut-hole CH4 is divided in half, one quartz-crystal castellation 404 (refer to FIG. 13) is formed. Although the explanation regarding the base wafer is omitted in this embodiment, as shown in FIG. 14, a rounded rectangle base cut-hole (not shown) is formed on both sides of the package base 42 to X-axis direction, on corresponding positions to the quartz-crystal wafer 40W. When the base cut-hole is divided in half, one base castellation 424 (refer to FIG. 13) is formed.

Fifth Embodiment

<Overall Configuration of Fifth Quartz-Crystal Vibrating Device 500>

Figure 15:
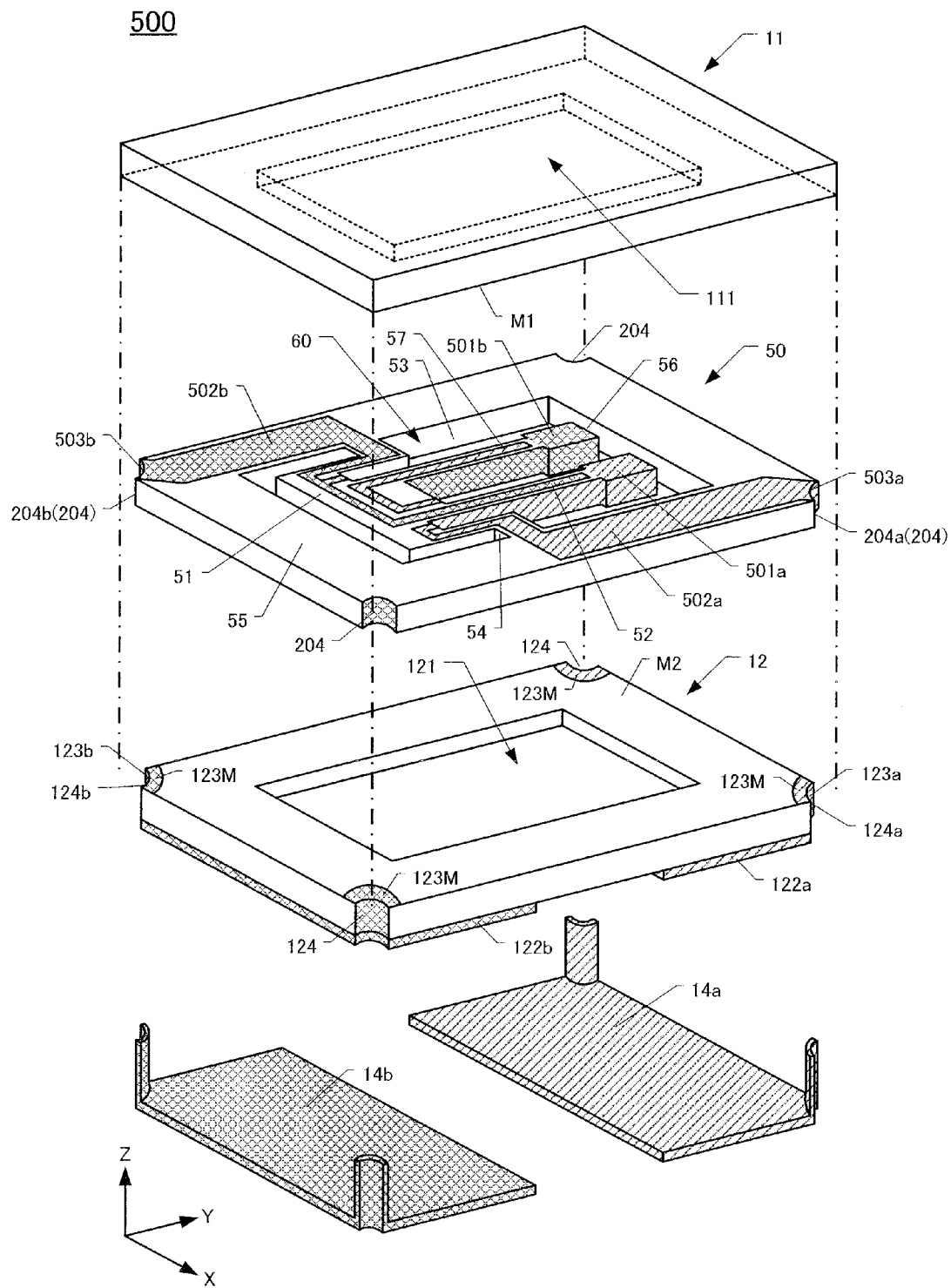
FIG. 15 is an exploded perspective view of the fifth quartz-crystal vibrating device 500 without adhesive 13.

Overall configuration of the fifth quartz-crystal vibrating device 500 is explained using FIG. 15 as reference. FIG. 15 is an exploded perspective view of the fifth quartz-crystal vibrating device 500 without adhesive 13. Since the fifth quartz-crystal vibrating device 500 in FIG. 15 has tuning-fork type quartz-crystal vibrating device 60, coordinates of the fifth quartz-crystal vibrating device 500 differs from coordinates used in the first to fourth embodiments.

In FIG. 15, X-axis remains referenced as the first to fourth embodiments, Y-axis refers to extending direction of the vibrating arm 52, and the vertical direction to X-axis and Y-axis is referred as Z-axis. In this embodiment, components that are similar to corresponding components in the third embodiment have the same respective reference numerals. As shown in FIG. 15, the fifth quartz-crystal vibrating device 500 includes the package lid 11, package base 12 and quartz-crystal frame 50 that is sandwiched between the package lid 11 and package base 12.

The quartz-crystal frame 50 includes the tuning-fork type quartz-crystal vibrating piece 60 formed on center region thereof, an outer frame 55 formed outside of the quartz-crystal vibrating piece, and a pair of supporting arms 54 that joins the tuning-fork type quartz-crystal vibrating piece and the outer frame 55. Between the tuning-fork type quartz-crystal vibrating piece 60, the outer frame 55 and a pair of supporting arms 54, a gap portion 53 is formed. The gap portion, which restricts exterior shape of the tuning-fork type quartz-crystal vibrating piece 60 is formed by wet etching. The tuning-fork type quartz-crystal vibrating piece 60 is formed with the same thickness as the outer frame 55 and a pair of supporting arms 54.

The tuning-fork type quartz-crystal vibrating piece 60 includes the base portion 51 formed in −Y-axis direction having rectangular shape from Z-axis direction, and a pair of vibrating arms 52 extending from one side of the base portion 51 toward +Y-axis direction.

A cross-section of a pair of the vibrating arms 52 is rectangular shaped, and have excitation electrodes 501a and 501b on both front surface and back surface. FIG. 15 only describes surface and one side of the tuning-fork type quartz-crystal vibrating piece 60. A groove 57 can be formed on front surface and back surface of a pair of the vibrating arms 52 extending to Y-axis direction. When excitation electrodes are formed on the groove 57, an electrical field on the vibrating arms 52 becomes large, thus prevents CI (crystal impedance) value from increasing. Further, a weight 56 can be formed on respective end tip to Y-axis direction of the vibrating arms 52. The weight 56 is formed to easily vibrate the pair of the vibrating arms 52 of the tuning-fork type quartz-crystal vibrating piece 60, and to adjust frequency. The tuning-fork type quartz-crystal vibrating piece 60 vibrates at, for example, 32.768 kHz, and is relatively small vibrating piece.

On the front surface Me and back surface Mi of the quartz-crystal frame 50, an extraction electrode 502a and 502b are formed from a pair of the supporting arms 54 to the outer frame 55. Extraction electrode 502a is extracted from the +X-axis to the external frame 55, and extraction electrode 502b is extracted from −X-axis to the external frame 55. Further, respective extraction electrodes 502a and 502b are electrically connected to excitation electrodes 501a and 501b formed on a pair of vibrating arms 52.

Further, in this fifth embodiment, since the extraction electrodes 502a and 502b are formed on both surface of the quartz-crystal frame 50, respective quartz-crystal side surface electrodes 503a and 503b are formed on the quartz-crystal castellations 204a and 204b. Other configuration is similar to the configuration explained in the first embodiment.

<Manufacturing Method of the Fifth Quartz-Crystal Vibrating Device 500>

The manufacturing method of the fifth quartz-crystal vibrating device 500 follows the same step as explained on the flow chart in FIG. 3. However, in step S12 of forming the quartz-crystal vibrating piece, a tuning-fork type quartz-crystal vibrating piece is formed instead of the quartz-crystal frame.

INDUSTRIAL APPLICABILITY

The quartz-crystal vibrating device of the respective embodiments have been described above; however, as evident to those skilled in the art, these embodiments may be carried out by means of a variety of changes and modifications within the technical scope of the disclosure.

For example, the piezoelectric device of the present disclosure may be applied to a quartz crystal oscillator loaded with a quartz crystal piece and an IC chip.

Also, the piezoelectric device of the present invention may be constructed by employing a piezoelectric material containing lithium tantalite, lithium niobate or piezoelectric ceramic instead of the quartz-crystal. Further, although the lid wafer and quartz-crystal wafer are bonded by nonconductive adhesive, such as low-melting-point glass and polyimide, in this disclosure, it may be bonded by anodic bonding or with eutectic metal.

What is claimed is:

1. A piezoelectric device, comprising:
a piezoelectric frame surrounding and formed as one unit with a piezoelectric vibrating piece, said piezoelectric frame and vibrating piece having opposed first and second principal surfaces and a pair of first castellations formed on a peripheral edge of said piezoelectric frame, said piezoelectric vibrating piece comprising first and second excitation electrodes formed on each of said first and second principal surface of said vibrating piece, a first extraction electrode formed on said first principal surface and extending from said first excitation electrode to a first side surface electrode on one of said pair of first castellations, and a second extraction electrode formed on said second principal surface and extending from said second excitation electrode to a second side surface electrode formed on the other of said pair of first castellations;
a package base having opposed first and second surfaces and a pair of second castellations formed on a peripheral edge of said package base and including a third side surface electrode formed on one of said second castellations and a fourth side surface electrode formed on the other of said second castellations, the first surface of said package base is bonded to the first principal surface of said piezoelectric frame by nonconductive adhesive; and
a package lid bonded to the second principal surface of said piezoelectric frame for sealing the piezoelectric vibrating piece with the package base;
wherein first and second connection electrodes are formed spanning adjacent first and second castellations to electrically connect said first extraction and first side surface electrodes on said piezoelectric frame to said third side surface electrode on said base and electrically connect said second extraction and second side surface electrodes on said piezoelectric frame to said fourth side surface electrode on said base, respectively.

2. The piezoelectric device of claim 1, wherein the non-conductive adhesive is formed on the first castellation and the second castellation, in a way it covers the connection electrode.

3. The piezoelectric device of claim 1, wherein, when looking from the first principal surface to the second principal surface, a periphery of the piezoelectric frame and a periphery of the package base are rectangular, and
wherein the first castellations and the second castellations are formed on corners of said piezoelectric frame and package base, respectively.

4. The piezoelectric device of claim 2, wherein, when looking from the first principal surface to the second principal surface, a periphery of the piezoelectric frame and a periphery of the package base are rectangular, and
wherein the first castellation and the second castellation are formed on corners of said piezoelectric frame and package base, respectively.

5. The piezoelectric device of claim 1, wherein, when looking from the first principal surface to the second principal surface, a periphery of the piezoelectric frame and a periphery of the package base are rectangular, and
wherein the first castellations and the second castellations are formed on sides of said piezoelectric frame and package base, respectively.

6. The piezoelectric device of claim 2, wherein, when looking from the first principal surface to the second principal surface, a periphery of the piezoelectric frame and a periphery of the package base are rectangular, and
wherein the first castellations and the second castellations are formed on sides of said piezoelectric frame and package base, respectively.

7. The piezoelectric device of claim 5, wherein the piezoelectric vibrating piece has thickness-shear vibrating mode;
wherein the periphery of the piezoelectric frame and the periphery of the package base each have a long side and a short side; and
wherein the first castellations and the second castellations are formed along the short sides of the piezoelectric frame and package base, respectively.

8. The piezoelectric device of claim 7, wherein one of said first castellations is disposed on each end of the piezoelectric vibrating piece and is on a center line of the piezoelectric vibrating piece parallel to the long side, and
wherein one of the second castellations is disposed on each end of the package base and is on a center line of the package base parallel to the long side.

9. The piezoelectric device of claim 1, wherein the adhesive includes a low-melting-point glass or polyimide resin having lower melting point than melting point of the base portion or the lid portion.

10. The piezoelectric device of claim 2, wherein the adhesive includes a low-melting-point glass or polyimide resin having lower melting point than melting point of the base portion or the lid portion.

11. The piezoelectric device of claim 3, wherein the adhesive includes a low-melting-point glass or polyimide resin having lower melting point than melting point of the base portion or the lid portion.

12. The piezoelectric device of claim 4, wherein the adhesive includes a low-melting-point glass or polyimide resin having lower melting point than melting point of the base portion or the lid portion.

13. The piezoelectric device of claim 1, wherein the piezoelectric vibrating piece is a piezoelectric vibrating piece having thickness-shear vibrating mode or a tuning-fork type piezoelectric vibrating piece having a pair of vibrating arms.

14. The piezoelectric device of claim 2, wherein the piezoelectric vibrating piece is a piezoelectric vibrating piece having thickness-shear vibrating mode or a tuning-fork type piezoelectric vibrating piece having a pair of vibrating arms.

15. The piezoelectric device of claim 3, wherein the piezoelectric vibrating piece is a piezoelectric vibrating piece having thickness-shear vibrating mode or a tuning-fork type piezoelectric vibrating piece having a pair of vibrating arms.

16. The piezoelectric device of claim 4, wherein the piezoelectric vibrating piece is a piezoelectric vibrating piece having thickness-shear vibrating mode or a tuning-fork type piezoelectric vibrating piece having a pair of vibrating arms.

* * * * *